United States Patent
Kim et al.

(10) Patent No.: US 11,531,872 B2
(45) Date of Patent: Dec. 20, 2022

(54) NEURON CIRCUIT USING P-N-P-N DIODE WITHOUT EXTERNAL BIAS VOLTAGES

(71) Applicant: Korea University Research and Business Foundation, Seoul (KR)

(72) Inventors: Sang Sig Kim, Seoul (KR); Kyoung Ah Cho, Seoul (KR); Young Soo Park, Seoul (KR); Doo Hyeok Lim, Seoul (KR); Sol A Woo, Gwacheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 207 days.

(21) Appl. No.: 16/896,560

(22) Filed: Jun. 9, 2020

(65) Prior Publication Data
US 2021/0150320 A1    May 20, 2021

(30) Foreign Application Priority Data
Nov. 14, 2019  (KR) .................... 10-2019-0145945

(51) Int. Cl.
| | | |
|---|---|---|
| G06N 3/063 | (2006.01) | |
| H01L 29/74 | (2006.01) | |
| H03K 17/72 | (2006.01) | |
| H01L 29/749 | (2006.01) | |

(52) U.S. Cl.
CPC ......... *G06N 3/063* (2013.01); *H01L 29/7408* (2013.01); *H01L 29/749* (2013.01); *H03K 17/72* (2013.01)

(58) Field of Classification Search
None
See application file for complete search history.

(56) References Cited

U.S. PATENT DOCUMENTS

| | | | | |
|---|---|---|---|---|
| 2015/0006455 | A1* | 1/2015 | Suri | ............ G06N 3/063 706/32 |
| 2016/0268447 | A1* | 9/2016 | Ritter | ............ H01L 29/87 |
| 2017/0255860 | A1* | 9/2017 | Ritter | ............ G06N 3/0635 |

FOREIGN PATENT DOCUMENTS

| | | | |
|---|---|---|---|
| CN | 102842340 B | * | 9/2015 |
| KR | 10-2017-0138047 A | | 12/2017 |
| KR | 10-2018-0127153 A | | 11/2018 |

OTHER PUBLICATIONS

An English translation of CN 102842340 B (Year: 2015).*
Vardhana et al., "Convolutional neural network for bio-medical image segmentation with hardware acceleration," Cognitive Systems Research, vol. 50, pp. 10-14, Aug. 2018.
Cauwenberghs, "An Analog VLSI Recurrent Neural Network Learning a Continuous-Time Trajectory," IEEE Transactions on Neural Networks, vol. 7, No. 2, pp. 346-361, Mar. 1996.
(Continued)

*Primary Examiner* — Khaja Ahmad
(74) *Attorney, Agent, or Firm* — NSIP Law

(57) ABSTRACT

The present disclosure relates to a novel neuron circuit using a p-n-p-n diode to realize small size and low power consumption. The neuron circuit according to one embodiment of the present disclosure may generate potential by charging current input from synapses through a capacitor. In this case, when the generated potential exceeds a critical value, the neuron circuit may generate and output a spike voltage corresponding to the generated potential using a p-n-p-n diode connected to the capacitor.

13 Claims, 17 Drawing Sheets

(56) References Cited

OTHER PUBLICATIONS

Weiss, Ryan John. "Analog Axon Hillock Neuron Design for Memristive Neuromorphic Systems." University of Tennessee (Dec. 2017).
Korean Office Action dated Feb. 17, 2022, in corresponding Korean Patent Application No. 10-2019-0145945 (6 pages in Korean).
Korean Office Action dated Jul. 11, 2022, in counterpart Korean Patent Application No. 10-2019-0145945 (5 pages in Korean).

* cited by examiner

NEURON CIRCUIT USING P-N-P-N DIODE WITHOUT EXTERNAL BIAS VOLTAGES

CROSS-REFERENCE TO RELATED APPLICATION

This application claims priority to Korean Patent Application No. 10-2019-0145945, filed on Nov. 14, 2019 in the Korean Intellectual Property Office, the disclosure of which is incorporated herein by reference.

BACKGROUND OF THE DISCLOSURE

Field of the Disclosure

The present disclosure relates to a neuron-imitating device and a neuron circuit using the same, and more particularly, to a neuron circuit using MOSFETs, a capacitor, and a silicon-based p-n-p-n diode nanostructure having a steep switching slope value due to a latch-up phenomenon. With this configuration, the neuron circuit of the prevent disclosure is capable of being driven using only synapse current introduced as an input to the circuit without application of an external bias, thereby lowering power consumption.

Description of the Related Art

Neuromorphic technology is a technology that imitates human nerve structures using electronic devices and circuits. Conventional von Neumann-based computers have a fast operating speed in sequential mathematical calculations, but have limitations in terms of speed and power consumption in calculating simultaneous inputs and outputs. This limitation is due to the structural characteristics of a memory and a processor being separated and connected via a bus, and the 'von Neumann bottleneck' phenomenon in which processing speed is delayed in parallel computation occurs.

Among various neuromorphic technologies, spiking neural network technology may be used to imitate the neural networks and brainwave action of the brain to implement more sophisticated thinking capabilities. To implement the spiking neural network, neurons and synapses must be implemented as an electronic device. In particular, research has been conducted worldwide to develop an electronic device imitating a neuron that is responsible for receiving stimuli through a number of synapses at the front end, integrating excitation, generating an electrical spike, and transmitting the electrical spike to synapses at the rear end.

A conventional neuron circuit consists of a comparator that integrates signals generated in synapses at the front end and generates a spike when a signal above a critical value is applied and additional circuits for preventing signal delay and securing stability. Due to this structural feature, in the conventional neuron circuit, a large number of transistors is used. Accordingly, problems such as increase in the total area of the neuron circuit and high power consumption occur. In addition, due to these structural limitations, the configuration of the neuromorphic system is complicated, and the precision of the system is limited. Therefore, to overcome these limitations, various neuron-imitating devices and circuits, such as resistive random-access memory (ReRAM), phase change memory (PCM), and conductive bridge memory (CBRAM), are being studied. However, in the case of such devices, since the conventional CMOS process cannot be applied, the uniformity and stability of the devices are deteriorated, and the devices are difficult to use in real life due to the complicated process thereof. Therefore, there is a need to develop a novel neuron circuit based on the CMOS process.

RELATED ART DOCUMENTS

Patent Documents

Korean Patent Application Publication No. 2017-0138047 "NEURON-IMITATING DEVICE AND CIRCUIT"
Korean Patent Application Publication No. 2018-0127153 "NEURAL SYSTEM-IMITATING INTEGRATED CIRCUIT INCLUDING INTEGRATE-AND-FIRE NEURON CIRCUIT AND SYNAPSE DEVICE ARRAY AND METHOD OF FABRICATING THE SAME"

Non-Patent Documents

M. Vardhana, N. Arunkumar, S. Lasrado, E. Abdulhay, and G. Ramirez "Convolutional Neural Network for Biomedical Image Segmentation with Hardware Acceleration" Cognitive Systems, vol. 50, pp. 10-14, Aug. 2018, doi: 10.1016/j.cogsys.2018.03.005.
G. Cauwenberghs. "An Analog VLSI Recurrent Neural Network Learning a Continuous-time Trajectory" IEEE Transactions on Neural Networks, vol. 7, no. 2, pp. 346-361, March 1996, doi: 10.1109/72.485671.

SUMMARY OF THE DISCLOSURE

Therefore, the present disclosure has been made in view of the above problems, and it is an object of the present disclosure to provide a neuron-imitating device having a simple structure capable of achieving high integration through fewer electrodes than conventional CMOS neuron-imitating devices.

It is another object of the present disclosure to provide a circuit and device capable of operating with lower standby power consumption than conventional CMOS neuron circuits.

It is still another object of the present disclosure to provide a neuron-imitating device and circuit to which a conventional CMOS process may be applied.

It is still another object of the present disclosure to provide a circuit capable of achieving high integration with fewer transistors than conventional CMOS neuron circuits.

It is still another object of the present disclosure to provide a neuron circuit with low power consumption that is capable of being driven using only synapse current introduced as an input to the circuit without application of an external bias. In terms of power consumption, the neuron circuit of the present disclosure is superior to conventional CMOS neuron circuits that require application of an external bias.

It is still another object of the present disclosure to provide a neuron circuit in which fire and reset are performed without a separate current and voltage signal controller.

It is yet another object of the present disclosure to provide a neuron-imitating device and circuit that may be used in a spiking neural network by considering changes in the synapse weight of synapse output current flowing into the input device of the neuron circuit.

In accordance with one aspect of the present disclosure, provided is a neuron circuit, wherein the neuron circuit generates potential by charging current input from synapses through a capacitor; and when the generated potential exceeds a critical value, the neuron circuit generates and outputs a spike voltage corresponding to the generated potential using a p-n-p-n diode connected to the capacitor.

According to one embodiment, the neuron circuit may reset the generated spike voltage using one or more transistors connected to the p-n-p-n diode.

According to one embodiment, an anode electrode of the p-n-p-n diode may be connected in parallel to the capacitor, and a cathode electrode of the p-n-p-n diode may be connected to the transistors.

According to one embodiment, among the transistors, a gate electrode of a first transistor may be connected to a gate line, and a drain electrode of the first transistor may be connected in series to the cathode electrode of the p-n-p-n diode; a gate electrode and drain electrode of a second transistor may be commonly connected to the drain electrode of the first transistor and a source electrode of the p-n-p-n diode; and a drain electrode of a third transistor may be commonly connected to the capacitor and the anode electrode of the p-n-p-n diode, and a gate electrode of the third transistor may be commonly connected to the gate electrode and drain electrode of the second transistor.

According to one embodiment, the spike voltage may be determined by voltage division between the first transistor and the p-n-p-n diode.

According to one embodiment, the p-n-p-n diode may generate a spike voltage corresponding to the generated potential using an avalanche breakdown phenomenon occurred inside a diode device by an anode voltage.

According to one embodiment, a frequency of the spike voltage may change depending on change in a time width of the input pulse and a magnitude of the input pulse.

According to one embodiment, the p-n-p-n diode may reduce the spike voltage by inducing reset current by a voltage generated in a gate electrode of the second transistor, and the p-n-p-n diode may reset the generated spike voltage by passing discharge current through the third transistor.

According to one embodiment, as current pulses input from synapses at the front end are integrated in the capacitor, the anode voltage may increase; as the anode voltage increases, a potential barrier formed by a reverse voltage bias level formed inside the p-n-p-n diode may increase; and as the potential barrier increases, when the drain voltage increases above a threshold voltage at which avalanche breakdown occurs, a latch-up phenomenon may occur by an impact ionization mechanism of the p-n-p-n diode.

According to one embodiment, electrical fire may occur at an output electrode ($V_{spike}$) according to voltage distribution between the p-n-p-n diode and the first transistor due to current flowing according to the occurred latch-up phenomenon.

According to one embodiment, when a spike voltage is generated at the output electrode ($V_{spike}$), a reset operation may be performed by discharging an electric charge and a voltage of $V_{spike}$ charged in the capacitor while both M2 and M3 are turned on by increased gate voltages of M2 and M3.

In accordance with another aspect of the present disclosure, provided is a neuron circuit, wherein the neuron circuit generates potential by charging current input from synapses through a capacitor; when the generated potential exceeds a critical value, the neuron circuit generates and outputs spike current corresponding to the generated potential using a p-n-p-n diode connected to the capacitor; and the neuron circuit resets the generated spike current using one or more transistors connected to the p-n-p-n diode.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
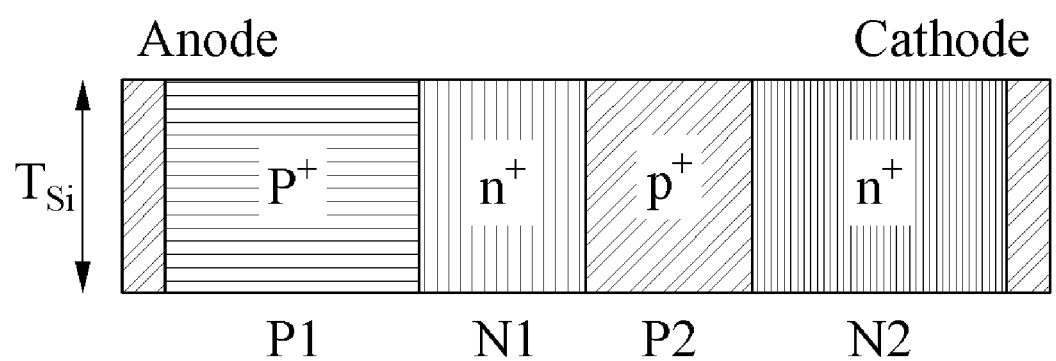
FIGS. 1A and 1B are drawings illustrating that a diode structure and an access electronic device are connected in series to form a p-n-p-n diode according to one embodiment.

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as 'first' and 'second' are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being 'connected to' or 'coupled to' another element, the element may be directly connected or coupled to the other element or intervening elements may be present. In contrast, when an element is referred to as being 'directly connected to' or 'directly coupled to' another element, there are no intervening elements present. Expressions describing relationships between components, such as 'between', 'immediately between', and 'directly neighboring', should be interpreted as well.

The terms used in the present specification are used to explain a specific exemplary embodiment and not to limit the present inventive concept. Thus, the expression of singularity in the present specification includes the expression of plurality unless clearly specified otherwise in context. Also, terms such as 'include' or 'comprise' should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

FIG. 1A illustrates a p-n-p-n diode nanostructure having two electrodes, which is a neuron-imitating device according to one embodiment.

Figure 1B:
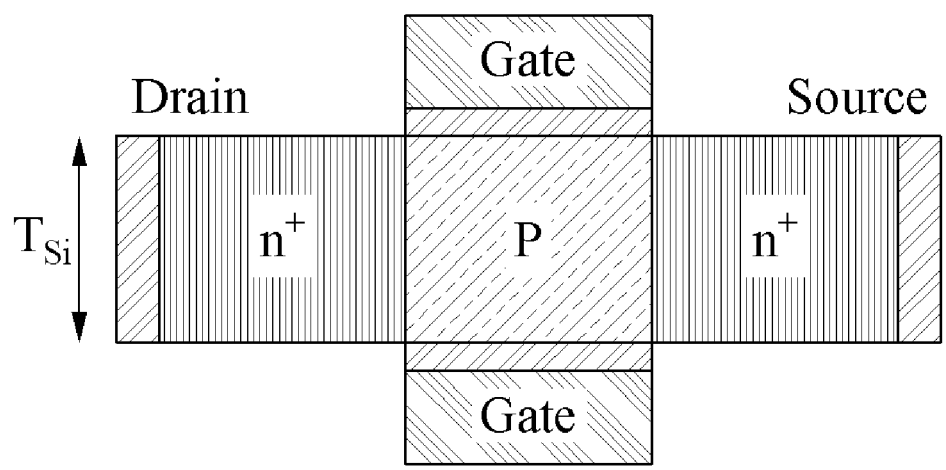

In addition, FIG. 1B illustrates a MOSFET included in a neuron circuit according to one embodiment.

Referring to FIG. 1A, the p-n-p-n diode consists of an anode, a cathode, and two electrodes.

The neuron-imitating device includes the p-n-p-n diode nanostructure, the anode electrode, and the cathode electrode. The anode region is in a p-doped state, and the cathode region is in an n-doped state.

Referring to FIG. 1A, the anode region of a diode structure 110 is connected to a bit line BL. Referring to FIG. 1B, the source region of an access electronic device 120 is connected to a source line SL. In addition, the n+-doping region of the diode structure 110 and the drain region of the access electronic device 120 may be connected in series to form a single device.

Under normal conditions, no current flows, but when a signal is applied to the bit line BL, current flows from the anode to the cathode. In addition, once current is applied, the flow of current does not stop until current is cut off.

Figure 2A:
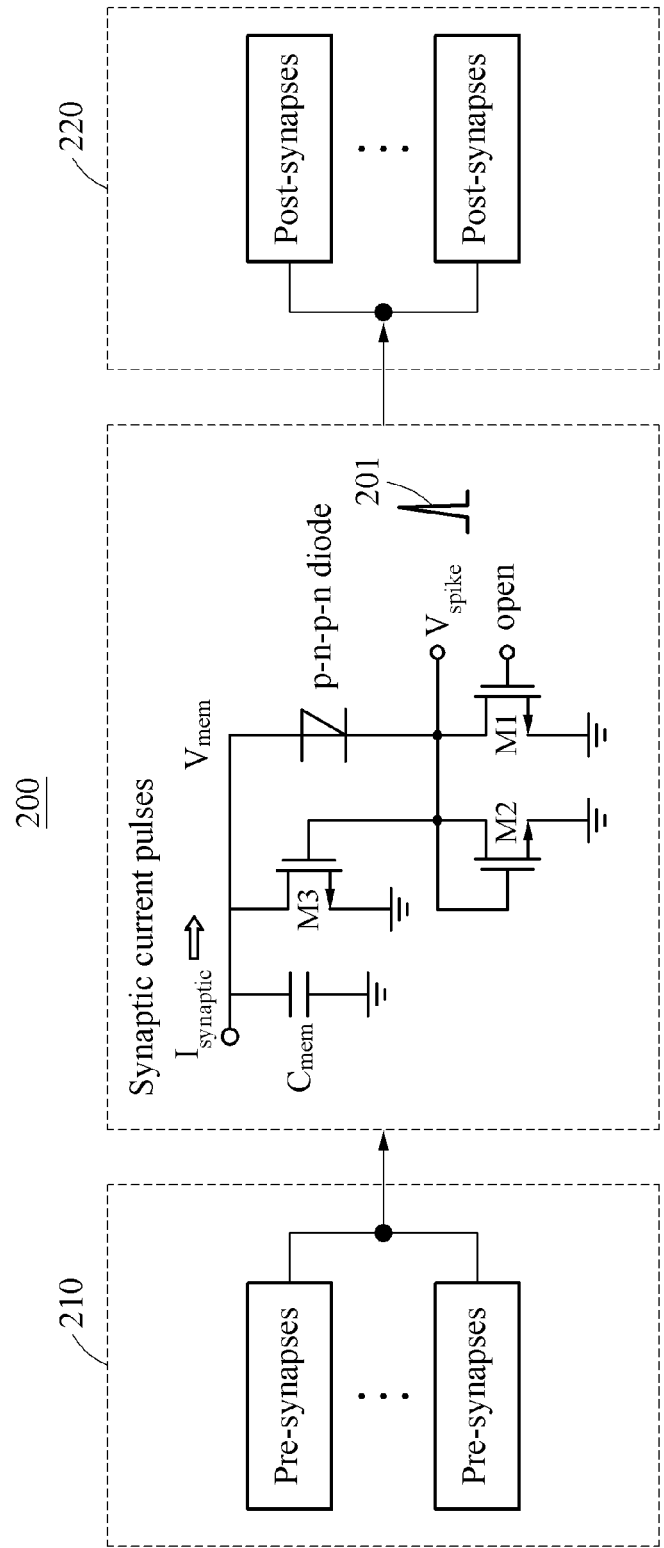
FIGS. 2A to 2F are block diagrams of a neuron circuit according to one embodiment.

FIG. 2A shows the block diagram of a free-biased neuron circuit according to one embodiment.

The present disclosure provides a free-biased neuron circuit capable of performing an integrate-and-fire function using a p-n-p-n diode and only four semiconductor devices including MOSFETs.

In particular, the p-n-p-n diode exhibits a latch-up phenomenon. The free-biased neuron circuit may provide integration of input pulses, generation of spikes, and a reset operation through minimal standby power consumption due to such a latch-up phenomenon.

In particular, in the free-biased neuron circuit, an integrate-and-fire operation may be self-driven without a separate signal controller. In addition, the neuron circuit may operate using only synapse current introduced as an input without a separate external bias.

FIG. 2A shows a free-biased neuron circuit provided with a basic neuromorphic block consisting of synapse devices 210 and 220 and a neuron circuit implementing a hardware-based SNN.

A free-biased neuron circuit 200 according to one embodiment may include a p-n-p-n diode, one or more transistors, and a capacitor ($C_{mem}$) for an integrating operation.

For example, three MOSFETs (M1 to M3) may be used as the transistors. In the embodiment of FIG. 2A, for convenience of description, three MOSFETs may be used as the transistors, or the design may be changed in various ways.

Hereinafter, examples of various design changes will be described in detail with reference to FIGS. 2B to 2F.

First, referring to FIG. 2A, pre-synapses 210 receive synapse outputs from neuronal cells to which the pre-synapses 210 are connected, and convert the synapse outputs into current inputs that reflect the weight of a synapse.

Synapse current inputs may be integrated by charging the capacitor of the free-biased neuron circuit 200 and generating potential.

In addition, when potential being charged reaches a critical value, the free-biased neuron circuit 200 according to one embodiment may generate an output spike 201.

As shown in FIG. 2A, the output spike 201 of the free-biased neuron circuit 200 may be transmitted to post-synapses 220.

The p-n-p-n diode used in the free-biased neuron circuit 200 may replace a MOSFET.

As shown in FIG. 2A, the CMOS process-based free-biased neuron circuit 200 is formed in a structure in which one p-n-p-n diode nanostructure as a neuron-imitating device, three MOSFETs, and one capacitor are connected. In this case, the anode electrode of the p-n-p-n diode nanostructure is connected in parallel to the drains of the MOSFETs and the capacitor, and receives input signals from pre-synapses. In addition, the gate of the MOSFET (M1) connected in series to the cathode electrode of the p-n-p-n diode nanostructure is connected in an open state without application of a bias. The capacitor connected in parallel to the p-n-p-n diode nanostructure integrates current signals transmitted from the pre-synapses. When a spike is generated, current flows through the MOSFET (M3) connected in parallel to the capacitor. Then, an electric charge stored in the capacitor is discharged by this current, and at the same time, current flows through the MOSFET (M2) connected in series to the cathode electrode of the p-n-p-n diode so that a reset operation is performed to lower a spiking voltage signal ($V_{spike}$) to 0 V. Then, the output $V_{spike}$ is transmitted to the post-synapses as an input. Accordingly, the CMOS process-based neuron circuit may perform an integrate-and-fire operation using only current signals generated in pre-synapses without a separate external bias, and may perform an integrate-and-fire operation by self-driving the circuit without assistance of an external circuit.

As shown in FIG. 2A, in operation of the neuron circuit 200, as current pulses generated at pre-synapses integrate in the capacitor, the anode voltage of the p-n-p-n diode nanostructure, $V_{mem}$, increases. At this time, $V_{mem}$ increases to 2.35 V, which is the threshold voltage of the p-n-p-n diode shown in FIG. 2A, and at the same time, the neuron circuit 200 performs a fire operation. When the fire operation is performed in the neuron circuit 200, a reset operation of reducing the $V_{mem}$ voltage to 0 V is performed. The electrical integrate-and-fire operation of the neuron circuit 200 imitates the integrate-and-fire operation of a biological neuron ranging from temporal integration to a refractory period.

Operation of each device of the neuron circuit 200 will be described in detail with reference to FIGS. 4A and 4B.

FIG. 2A shows the neuron circuit 200 implemented using one capacitor ($C_{mem}$), one diode (p-n-p-n diode), and three transistors (MOSFETs).

In implementing a neuron circuit, one capacitor ($C_{mem}$) and one diode (p-n-p-n diode) are essential for potential, but at least one of three transistors (MOSFETs) may be selectively replaced with another device.

Hereinafter, embodiments of various neuron circuits to which the present invention is applied will be described with reference to FIGS. 2B to 2F.

Figure 2B:
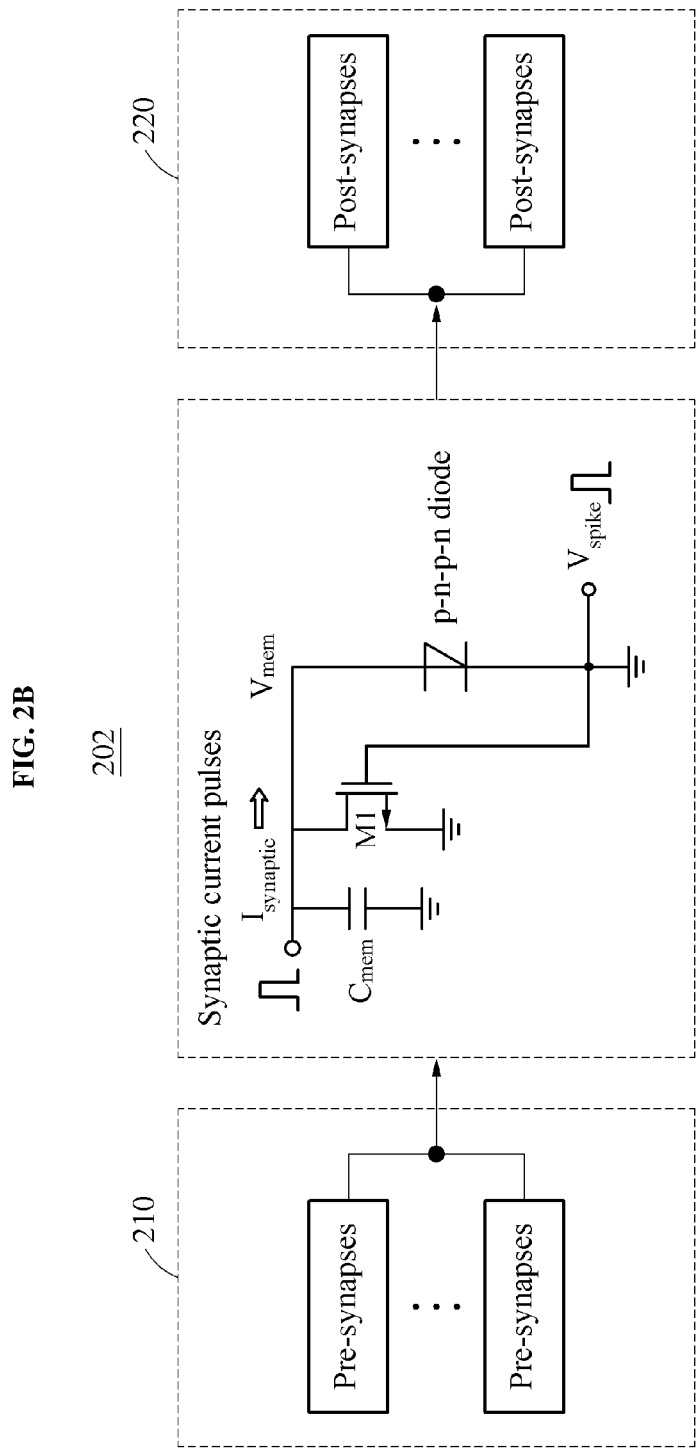

First, in FIG. 2B, instead of the neuron circuit 200 of FIG. 2A, a neuron circuit 202 may be implemented using only one capacitor ($C_{mem}$), one diode (p-n-p-n diode), and one transistor (M1).

The neuron circuit 202 may charge the capacitor ($C_{mem}$) through a synapse current input to integrate potential.

In addition, when the potential charged in the capacitor ($C_{mem}$) reaches a critical value, the neuron circuit 202 may generate an output spike through the output electrode of the diode (p-n-p-n diode).

Figure 2C:
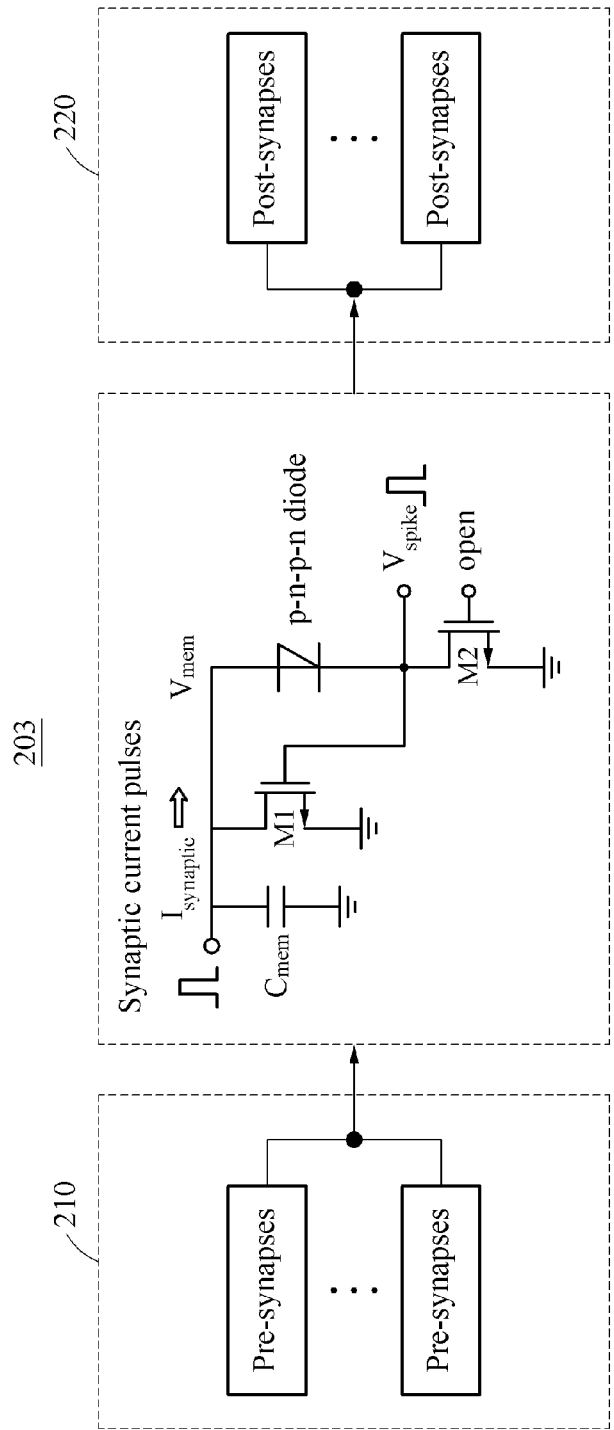

In FIG. 2C, instead of the neuron circuit 200 of FIG. 2A, a neuron circuit 203 may be implemented using one capacitor ($C_{mem}$), one diode (p-n-p-n diode), and two transistors (M1 and M2).

The neuron circuit 203 may charge the capacitor ($C_{mem}$) through a synapse current input to integrate potential.

In addition, when the potential charged in the capacitor ($C_{mem}$) reaches a critical value, the neuron circuit 203 may generate an output spike through the output electrode of the diode (p-n-p-n diode).

The anode electrode of the p-n-p-n diode nanostructure is connected in parallel to the drains of the MOSFETs and the capacitor, and receives input signals from pre-synapses. In addition, the gate of the MOSFET (M2) connected in series to the cathode electrode of the p-n-p-n diode nanostructure is connected in an open state without application of a bias. The capacitor connected in parallel to the p-n-p-n diode nanostructure integrates current signals transmitted from the pre-synapses. When a spike is generated, current flows through the MOSFET (M1) connected in parallel to the capacitor. Then, an electric charge stored in the capacitor is discharged by this current, and a reset operation is performed to lower a spiking voltage signal ($V_{spike}$) to 0 V. Then, the output $V_{spike}$ is transmitted to the post-synapses as an input. Accordingly, the CMOS process-based neuron circuit 203 may perform an integrate-and-fire operation using only current signals generated in pre-synapses without a separate external bias, and may perform an integrate-and-fire operation by self-driving the circuit without assistance of an external circuit.

Figure 2D:
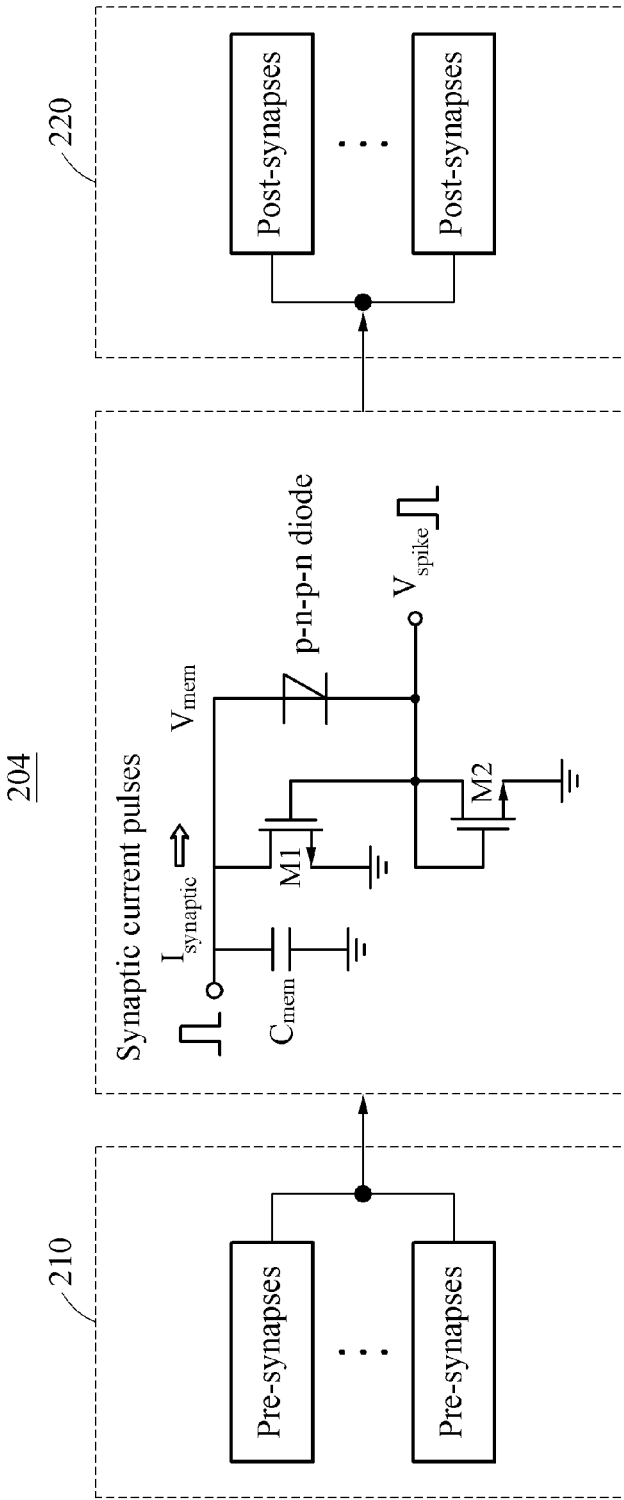

In FIG. 2D, instead of the neuron circuit 200 of FIG. 2A, a neuron circuit 204 may be implemented using one capacitor ($C_{mem}$), one diode (p-n-p-n diode), and two transistors (M1 and M2).

The anode electrode of the p-n-p-n diode nanostructure is connected in parallel to the drains of the MOSFETs and the capacitor, and receives input signals from pre-synapses. The capacitor connected in parallel to the p-n-p-n diode nanostructure integrates current signals transmitted from the pre-synapses. When a spike is generated, current flows through the MOSFET (M1) connected in parallel to the capacitor. Then, an electric charge stored in the capacitor is discharged by this current, and at the same time, current flows through the MOSFET (M2) connected in series to the cathode electrode of the p-n-p-n diode so that a reset operation is performed to lower a spiking voltage signal ($V_{spike}$) to 0 V. Then, the output $V_{spike}$ is transmitted to the post-synapses as an input.

Figure 2E:
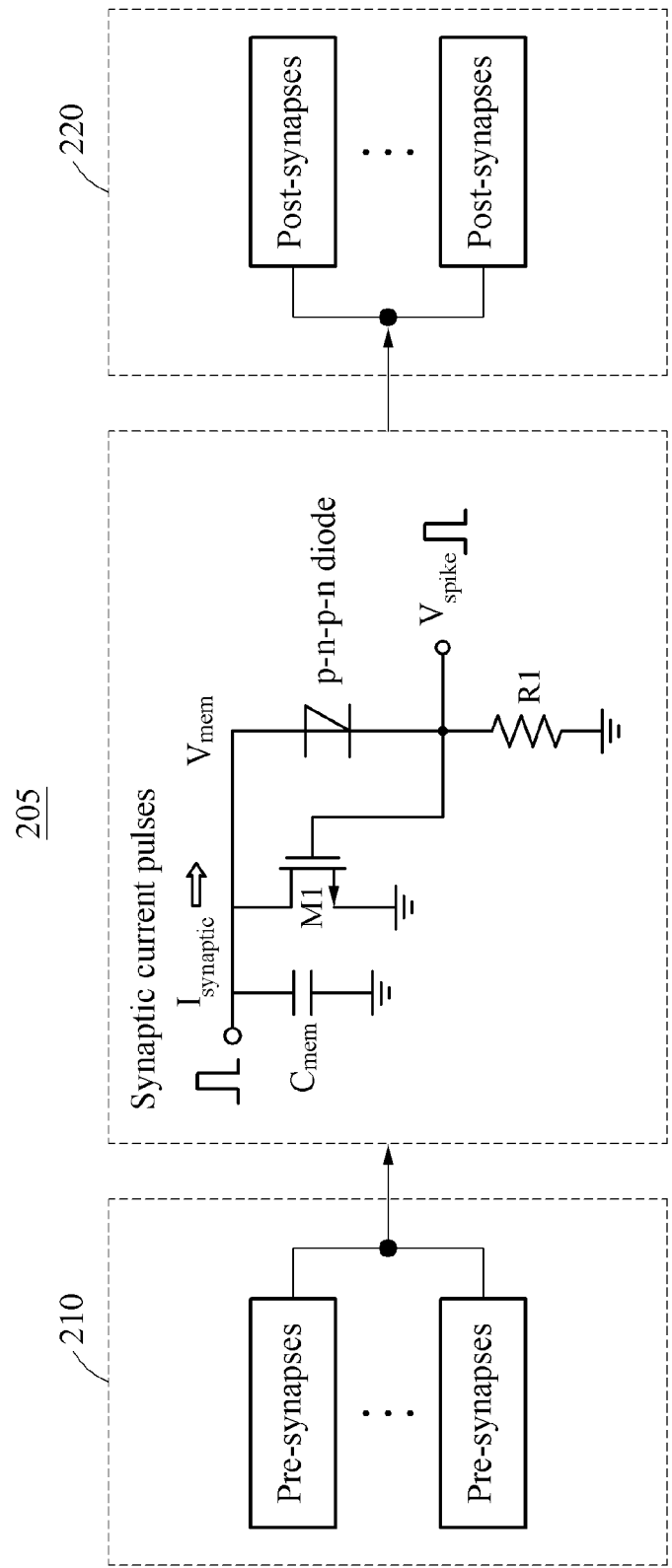
Figure 2F:
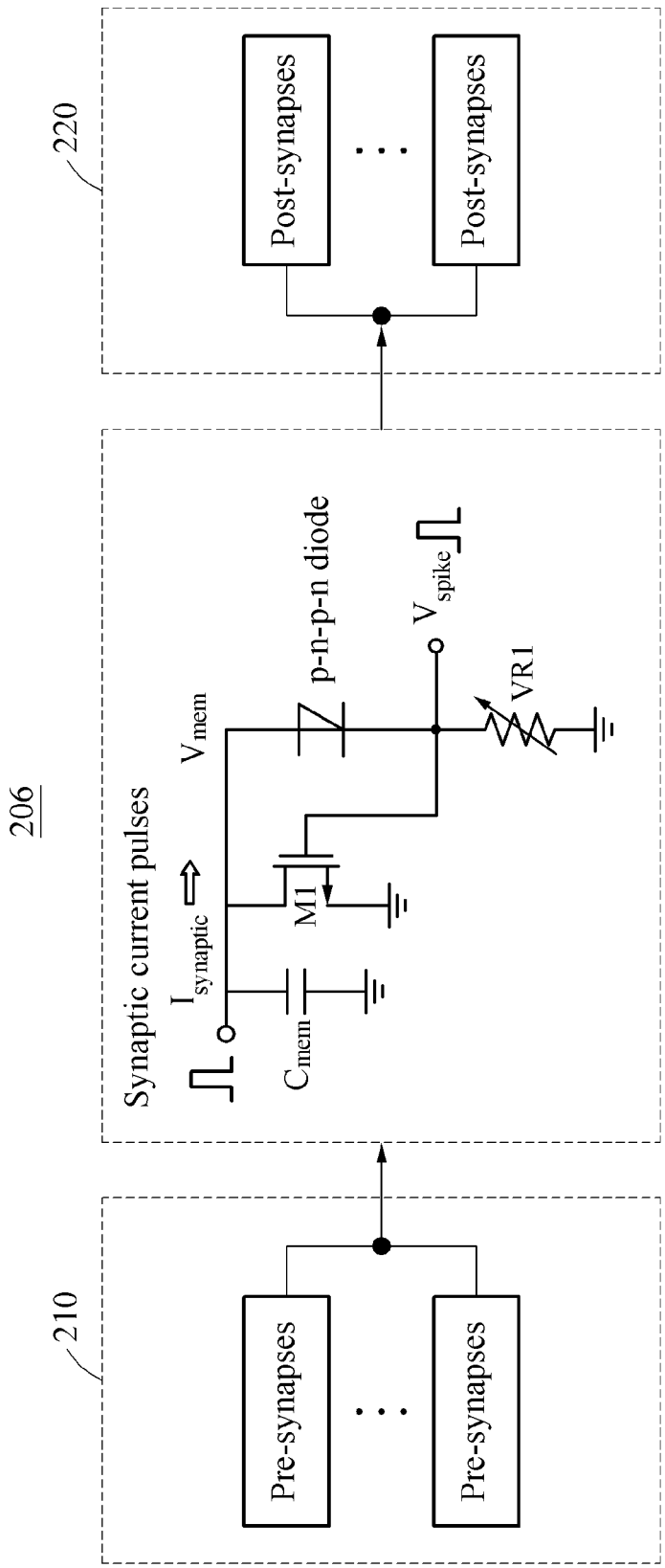

In FIG. 2E, a neuron circuit 205 is implemented by replacing the MOSFET (M2) in the embodiment of FIG. 2C with resistance (R1). In FIG. 2F, a neuron circuit 206 is implemented by replacing the MOSFET (M2) in the embodiment of FIG. 2C with variable resistance (VR1).

Figure 3A:
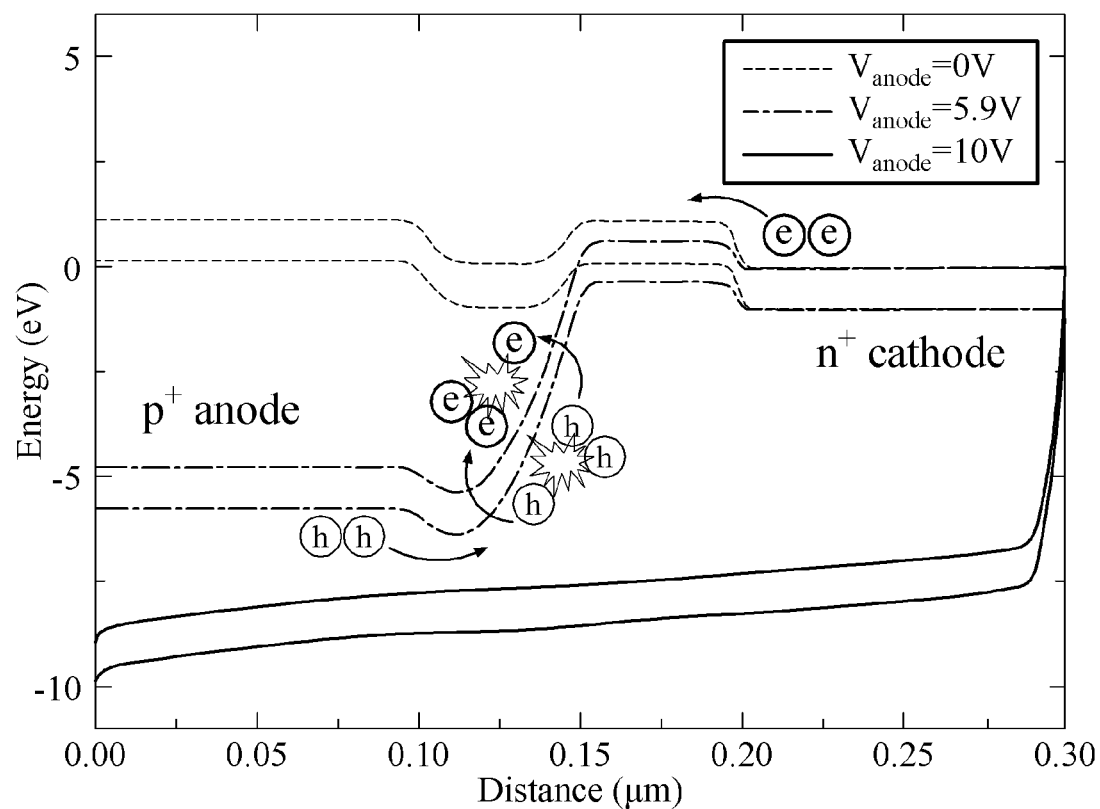
FIG. 3A is a drawing for explaining an energy band diagram depending on the anode voltages of a p-n-p-n diode.

FIG. 3A is a drawing for explaining an energy band diagram 310 depending on the anode voltages of a p-n-p-n diode.

Figure 3B:
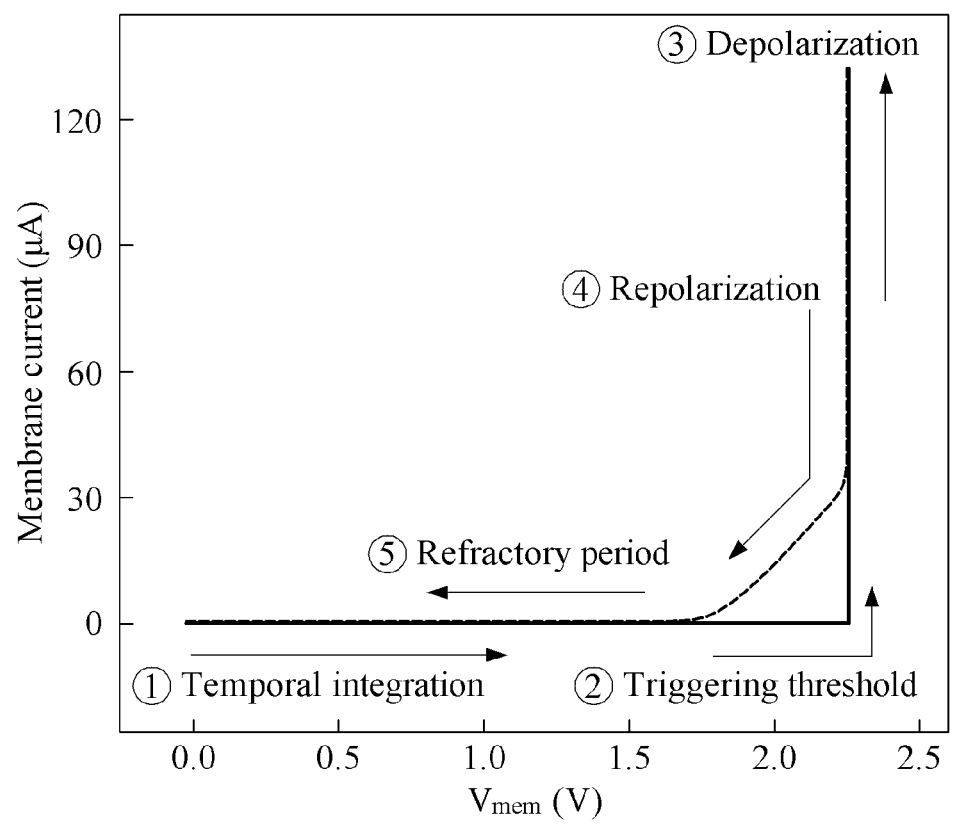
FIG. 3B is a drawing for explaining a current characteristic diagram depending on the anode voltages of a p-n-p-n diode.

In the case of the p-n-p-n diode having the structure of FIG. 1A, a reverse bias level is formed inside the device, thereby increasing the magnitude of an internal potential barrier at 5.9 V as shown in the energy band diagram 310. Accordingly, the p-n-p-n diode exhibits neuron-imitating device characteristics due to a latch-up phenomenon. As shown in FIG. 3B, in the neuron-imitating device, as an anode voltage increases, a latch-up phenomenon occurs at a certain voltage. That is, the p-n-p-n diode may operate using a mechanism that differs from that of a conventional three-terminal FBFET device.

FIG. 3B is a drawing for explaining a current characteristic diagram 320 depending on the anode voltages of a p-n-p-n diode. As shown in the current characteristic diagram 320, the p-n-p-n diode nanostructure exhibits a latch-up phenomenon in which current rapidly increases when the drain voltage of the device is about 2.35 V. A fire-and-integrate neuron circuit with very low standby power consumption may be implemented using low leakage current due to the latch-up characteristics of the p-n-p-n diode, which is a neuron-imitating device.

In the MOSFET neuron circuit, $V_{mem}$ may act as a triggering critical value that opens a channel for a corresponding transistor by providing a gate voltage to the transistor, and has a magnitude of 2.35 V.

However, for $V_{mem}$ less than 2.35 V, $V_{spike}$ may have already been generated due to subthreshold swing (SS). In this case, since the subthreshold swing is greater than 60 mV/dec, a problem that the time width of $V_{spike}$ becomes larger than 20 µs may occur.

In addition, for one integrate-and-fire operation, the MOSFET neuron circuit consumes a power of 1.59 mW (or an energy of $7.62 \times 10^{-11}$ J) with an energy efficiency of 43.0%.

Compared to the MOSFET neuron circuit, the free-biased neuron circuit 200 may consume much less energy per one integrate-and-fire operation.

Power consumption, energy consumption, and energy efficiency are 0.85 mW, $1.72 \times 10^{-12}$ J, and 99.5%, respectively. The excellent energy efficiency of the free-biased neuron circuit 200 may be attributed to the narrow time width (about 0.8 µs) of $V_{spike}$. Latch up of anode current and the high ratio of anode current to off current of the p-n-p-n diode are responsible for narrowing the time width of $V_{spike}$. Accordingly, the free-biased neuron circuit 200 using the p-n-p-n diode is superior to the neuron circuit consisting only of MOSFETs in terms of structural simplicity and energy efficiency.

The graph shows the current-voltage characteristics of the p-n-p-n diode during performing an integrate-and-fire operation in the free-biased neuron circuit 200 corresponding to the integrate-and-fire operation of a biological neuron.

The neuron circuit according to the present disclosure may perform an integrate-and-fire function with low power consumption by using the characteristics of the p-n-p-n diode, which is a neuron-imitating device.

In the neuron circuit according to the present disclosure, as current pulses input from synapses at the front end are integrated in a capacitor, $V_{mem}$, which is the drain voltage of the p-n-p-n diode, increases.

Accordingly, a potential barrier formed by a reverse voltage bias level formed inside the p-n-p-n diode gradually increases.

In addition, as the potential barrier increases, when the voltage of $V_{mem}$ increases above a threshold voltage at which avalanche breakdown occurs, a latch-up phenomenon occurs by the mechanism of the p-n-p-n diode, and current flows suddenly.

At this time, electrical fire may occur at an output electrode ($V_{spike}$) according to voltage distribution between the p-n-p-n diode and the first transistor.

In addition, when a spike voltage is generated at the output electrode ($V_{spike}$), a reset operation may be performed by discharging an electric charge and the voltage of $V_{spike}$ charged in a capacitor while both M3 and M2 are turned on by the increased gate voltages of M3 and M2.

Figure 4A:
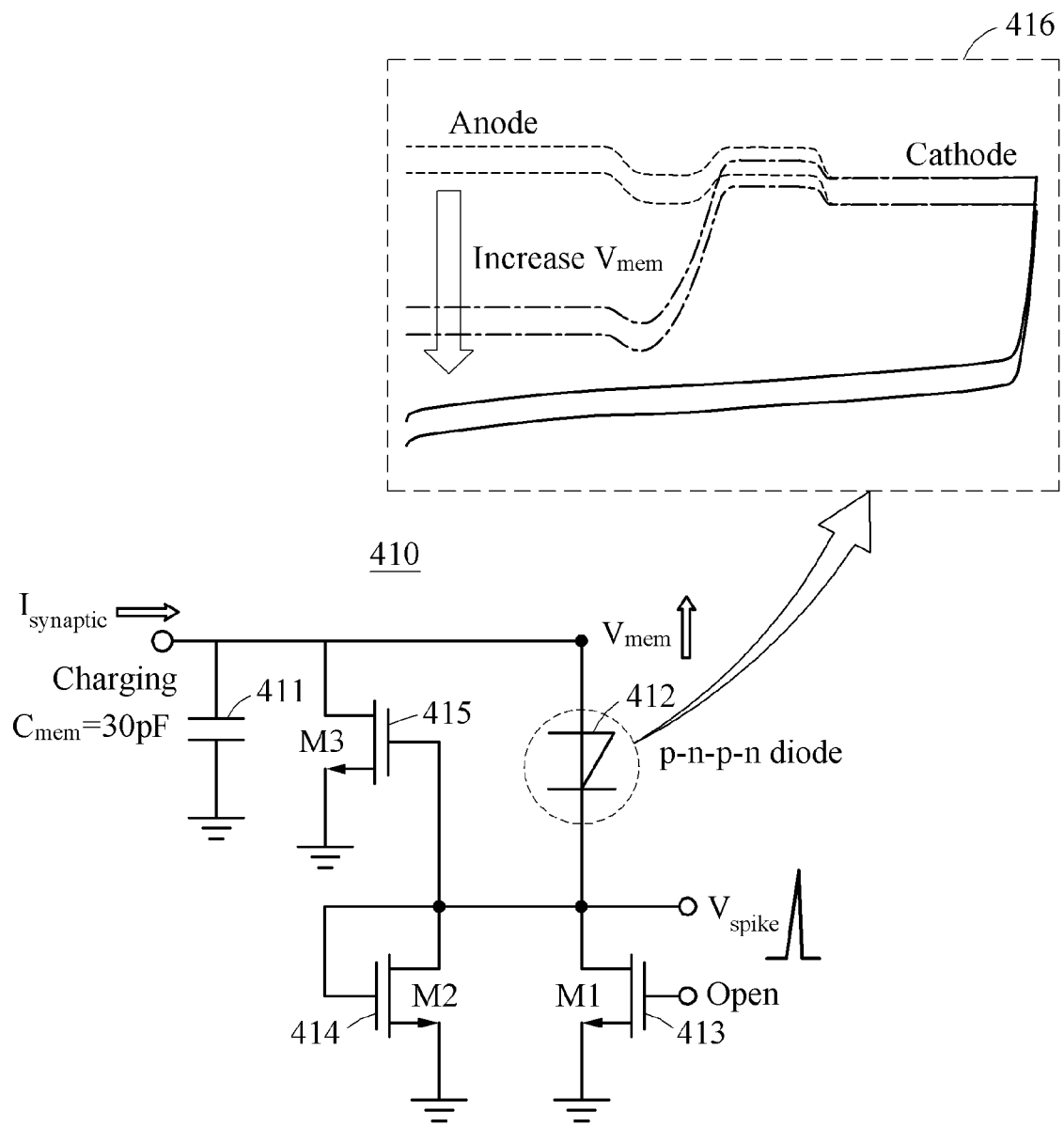
FIGS. 4A and 4B are drawings for explaining the spike and reset mechanism of a neuron circuit including various energy band diagrams of a p-n-p-n diode.

FIG. 4A includes drawings for explaining the spike mechanism of a neuron circuit 410 having an energy band diagram according to $V_{mem}$.

Figure 4B:
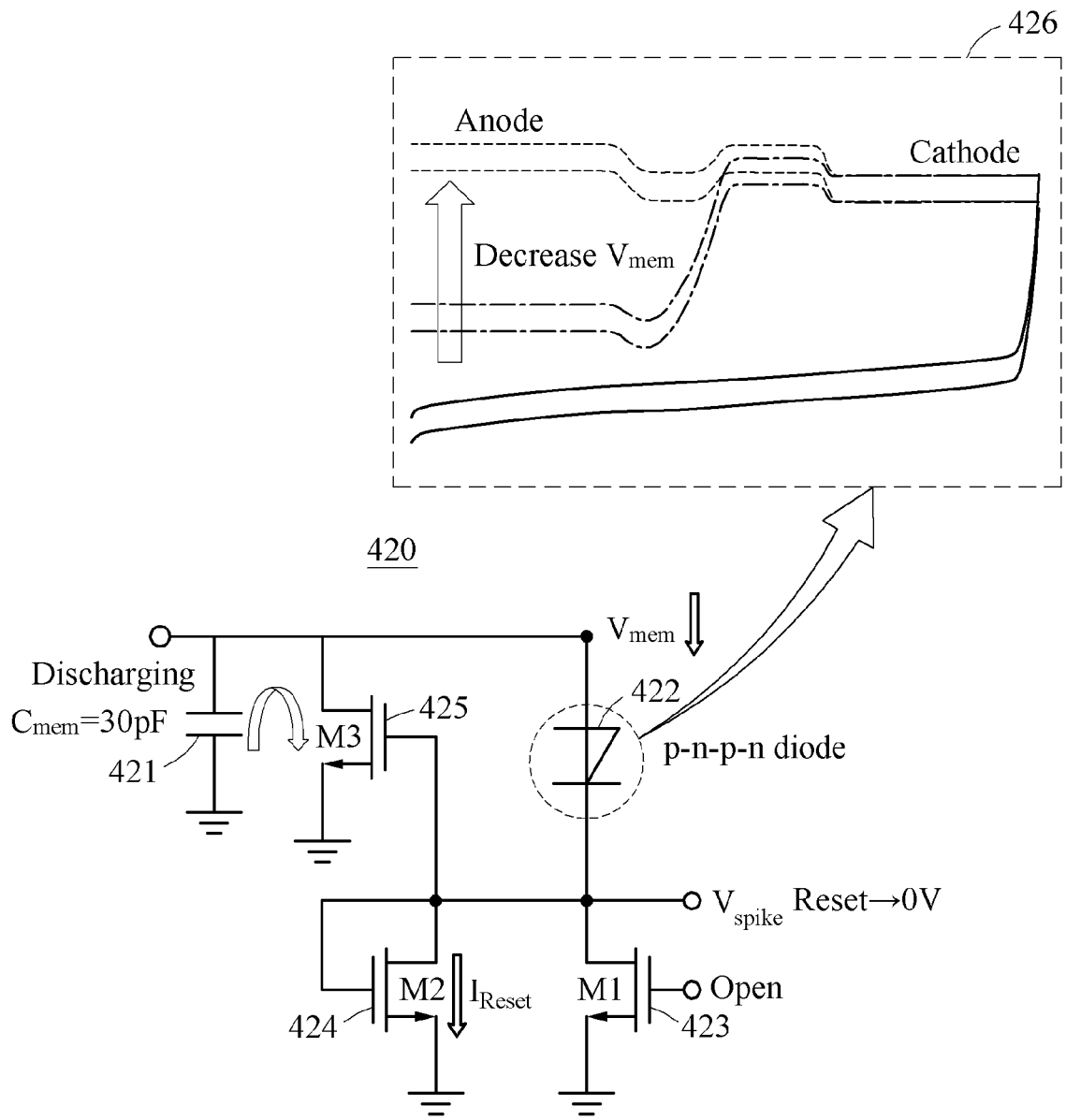

FIGS. 4A and 4B illustrate the spike and reset mechanism of the neuron circuit 410 including various energy band diagrams of a p-n-p-n diode.

The neuron circuit 410 may generate potential by charging current input from synapses in a capacitor 411. In addition, when the generated potential exceeds a critical value, the neuron circuit 410 may generate and output a spike voltage corresponding to the generated potential using a p-n-p-n diode 412 connected to the capacitor 411. In addition, the neuron circuit 410 may reset the generated spike voltage using the transistors 413, 414, and 415 connected to the p-n-p-n diode.

The anode electrode of the p-n-p-n diode 412 may be connected in parallel to the capacitor 411, and the cathode electrode of the p-n-p-n diode 412 may be connected to the transistors 413, 414, and 415.

The connection relationship between the transistors 413, 414, and 415 is as follows. First, the gate electrode of the first transistor 413 (M1) may be connected to a gate line ($V_{GL}$), and the drain electrode of the first transistor 413 (M1) may be connected in series to the source electrode of the p-n-p-n diode 412.

In addition, the gate electrode and drain electrode of the second transistor 414 (M2) may be commonly connected to the drain electrode of the first transistor 413 (M1) and the cathode electrode of the p-n-p-n diode 412.

In addition, the drain electrode of the third transistor 415 (M3) may be commonly connected to the capacitor 411 and the anode electrode of the p-n-p-n diode 412, and the gate electrode of the third transistor 415 (M3) may be commonly connected to the gate electrode and drain electrode of the second transistor 414 (M2).

Meanwhile, the critical value of the anode electrode of the p-n-p-n diode 412 may be defined as $V_{mem}$ for spike and a reset operation.

The voltage of the output electrode of the p-n-p-n diode 412 and the voltage of the gate line ($V_{GL}$) of the first transistor may determine an appropriate critical value and spike voltage for an output voltage ($V_{spike}$).

These voltages may change the characteristics of a neuron circuit, such as critical values for triggering and spike frequencies.

When a certain voltage (e.g., $V_{GL}$=450 mV) is applied to the output electrode and gate line ($V_{GL}$) of the p-n-p-n diode 412, an integrate-and-fire operation is performed by increase of $V_{mem}$ by synapse current input $I_{synaptic}$.

When a current input pulse $I_{synaptic}$ is applied to the neuron circuit 410, a sum of input current may be integrated while increasing $V_{mem}$ potential in the capacitor 411.

Accordingly, each time the current input pulse $I_{synaptic}$ is applied, $V_{mem}$ gradually increases as shown in Drawing Symbol 416 of FIG. 4A.

When $V_{mem}$ exceeds a critical value, $V_{spike}$ increases suddenly upon occurrence of a spike. A spike voltage may be determined voltage division between the p-n-p-n diode 412 and the first transistor 413 (M1).

FIG. 4B includes drawings for explaining a reset operation of a neuron circuit using an energy band diagram depending on $V_{mem}$.

FIG. 4B shows that the potential barrier of a p-n-p-n diode 422 is regenerated by reducing $V_{mem}$ by a reset operation of a neuron circuit 420.

When $V_{spike}$ increases in a short time, the gate voltage of a second transistor 424 (M2) may induce reset current ($I_{Reset}$). In addition, $V_{spike}$ may be reduced by the induced reset current ($I_{Reset}$). In addition, the gate voltage of a third transistor 425 (M3) connected to the second transistor 424 (M2) may also be reduced. As the gate voltage of the third transistor 425 (M3) decreases, current for discharging a capacitor 421 may be induced, and as a result, the $V_{mem}$ of the p-n-p-n diode may decrease.

Accordingly, as shown in an energy band diagram 426, the $V_{mem}$ of the charged p-n-p-n diode may gradually decrease while being discharged.

After reset operation, each time synapse input current $I_{synaptic}$ flows through the neuron circuit 420, an operation of integrate-and-fire is repeated.

Figure 4C:
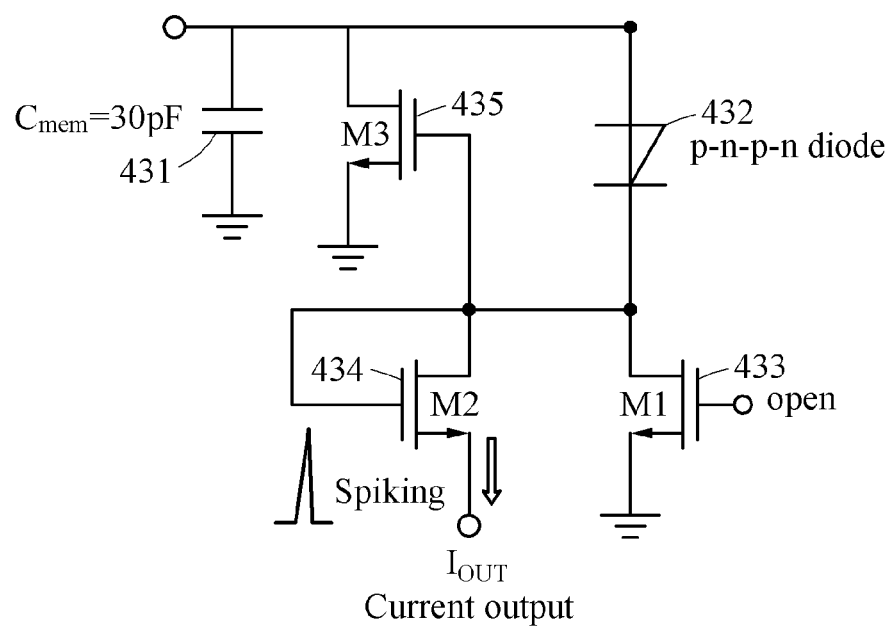
FIG. 4C is a drawing for explaining an embodiment of a neuron circuit operating in a current mode.

FIG. 4C is a drawing for explaining an embodiment of a neuron circuit operating in a current mode.

A neuron circuit 430 may generate potential by charging current input from synapses in a capacitor 431. In addition, when the generated potential exceeds a critical value, the neuron circuit 430 may generate and output ($I_{OUT}$) spike current corresponding to the generated potential using a p-n-p-n diode 432 connected to the capacitor 431. In addition, the neuron circuit 430 may reset the generated spike current using transistors 433, 434, and 435 connected to the p-n-p-n diode.

The anode electrode of the p-n-p-n diode 432 may be connected in parallel to the capacitor 431, and the cathode electrode of the p-n-p-n diode 432 may be connected to the transistors 433, 434, and 435.

The connection relationship between the transistors 433, 434, and 435 is as follows. First, the gate electrode of a first transistor 433 (M1) may be connected to a gate line ($V_{GL}$), and the drain electrode of the first transistor 433 (M1) may be connected in series to the cathode electrode of the p-n-p-n diode 432.

In addition, the gate electrode and drain electrode of a second transistor 434 (M2) may be commonly connected to the drain electrode of the first transistor 433 (M1) and the cathode electrode of the p-n-p-n diode 432.

In addition, the drain electrode of a third transistor 435 (M3) may be commonly connected to the capacitor 411 and the anode electrode of the p-n-p-n diode 432, and the gate electrode of the third transistor 435 (M3) may be commonly connected to the gate electrode and drain electrode of the second transistor 434 (M2).

Figure 4D:
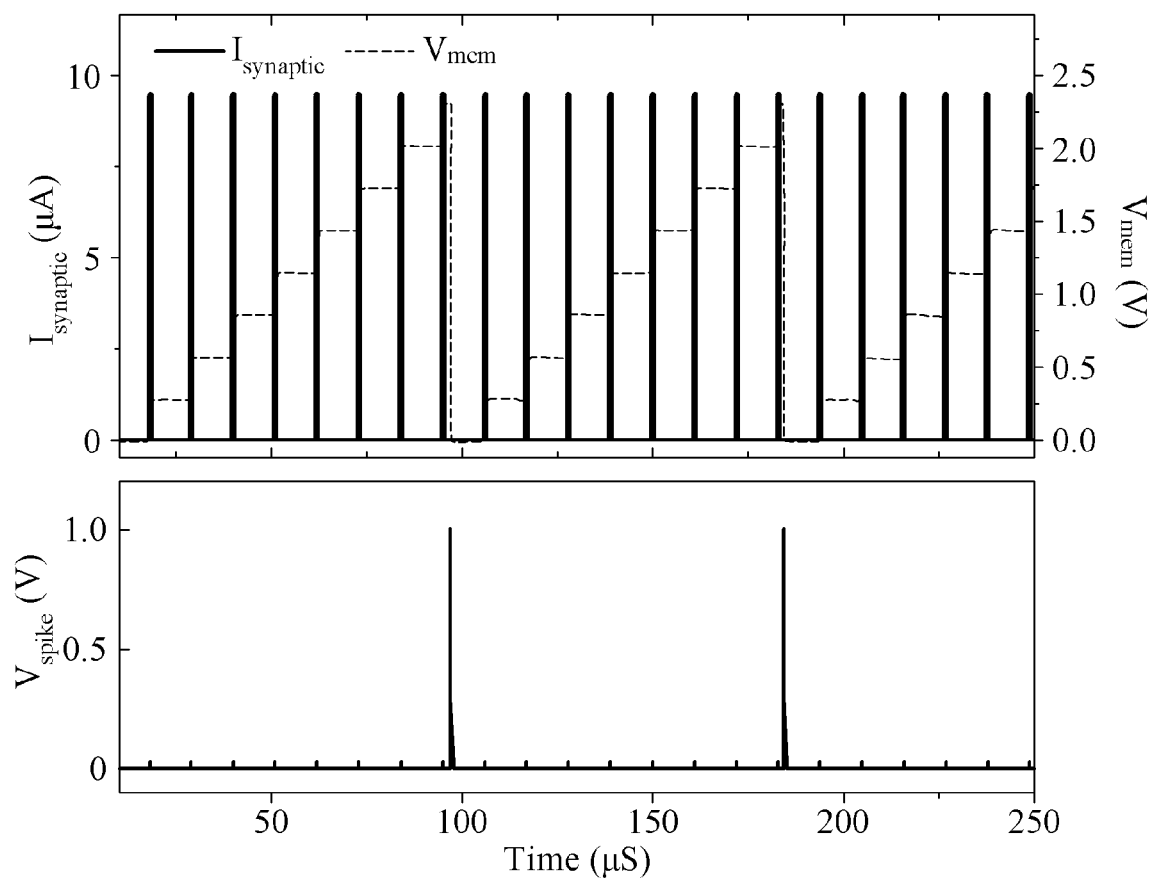
FIG. 4D includes drawings for explaining the simulated timing diagram of a neuron circuit according to one embodiment.

FIG. 4D includes drawings for explaining a simulated timing diagram 440 of a neuron circuit according to one embodiment.

The neuron circuit may require a series of initialization operations on the p-n-p-n diode to perform an IF operation. After the initialization operations of the neuron circuit are performed, an input current pulse ($I_{synaptic}$) of 9.5 µA with a time width of 0.8 µs is applied to the neuron circuit for 250 µs with a period of 10 µs. Each time an input pulse 441 is applied, $V_{mem}$ 442 increases by 0.3 V. The $V_{mem}$ 442 may exceed a critical value by applying the input pulse 441 eight times.

When the critical value is exceeded, an output spike pulse ($V_{spike}$) of 0.0 V to 1.1 V is generated.

Each $I_{synaptic}$ of 9.5 µA may increase $V_{mem}$ to 0.287 V during time integration.

When eight input current pulses ($I_{synaptic}$) arrive at $C_{mem}$ and $V_{mem}$ reaches a triggering critical value of 2.3 V, $V_{spike}$ may rapidly increase from 0.0 V to 1.02 V during depolarization. During subsequent repolarization, both $V_{mem}$ and $V_{spike}$ may reset to an initial voltage of 0.0 V.

During a period of depolarization and repolarization, the neuron circuit may generate a $V_{spike}$ pulse with an amplitude of 1.02 V. In the case of $I_{synaptic}$, $V_{spike}$ may be fired repeatedly at a frequency of 11.7 kHz. In addition, the neuron circuit according to the present disclosure requires initialization of the p-n-p-n diode to occur integrate-and-fire.

When reset is completed, $V_{spike}$ and $V_{mem}$ may return to an initial value ($V_{spike}=V_{mem}=0.0$ V) to repeat an IF operation. Thereafter, the next repeated synapse input pulse may increase $V_{mem}$ again, and this cycle of the integrate-and-fire operation normally occurs as shown in FIG. 4D.

As a result, the neuron circuit according to one embodiment of the present disclosure may exhibit an IF operation of about 20 kHz firing frequency using only four transistors.

In terms of the number of transistors used, device type, the type of synapse input, power consumption, and firing frequency, the performance of the neuron circuit according to the present disclosure is superior to that of conventional neuron circuits.

The firing frequency of the neuron circuit depends on the amplitude and time width of $I_{synaptic}$. As the amplitude or time width of $I_{synaptic}$ increases, time taken for $V_{mem}$ to increase to a triggering critical value may be shortened.

In the neuron circuit according to the present disclosure, as the amplitude of $I_{synaptic}$ with a time width of 0.8 µs and a period of 10 µs increases by 0.5 µA from 9.5 µA to 11 µA, a firing frequency may increase from 8.1 kHz to 15.6 kHz. In addition, as the time width ($t_{synaptic}$) of $I_{synaptic}$ with an amplitude of 10 µA and a period of 10 µs increases by 0.1 µs, a period may change from 0.6 µs to 0.9 µs, and a firing frequency may increase from 11.5 kHz to 24.0 kHz. That is, by adjusting the amplitude and time width of an $I_{synaptic}$ pulse, the firing frequency of the neuron circuit may be controlled.

Among conventional neuron circuits, conductance-based neuron circuits and neuron circuits using a Hindmarsh-Rose model seem to consume the highest power at low firing frequency using many transistors. In addition, in the case of CMOS-based neuron circuits, the Izhikevich model with excellent firing frequency requires 14 transistors and high power consumption of 40 µW. In addition, other conventional neuron circuits require more than 20 transistors.

In conclusion, the neuron circuit of the present disclosure has a small circuit area, and is the simplest and the most efficient circuit in terms of power consumption and firing frequency.

Figure 5A:
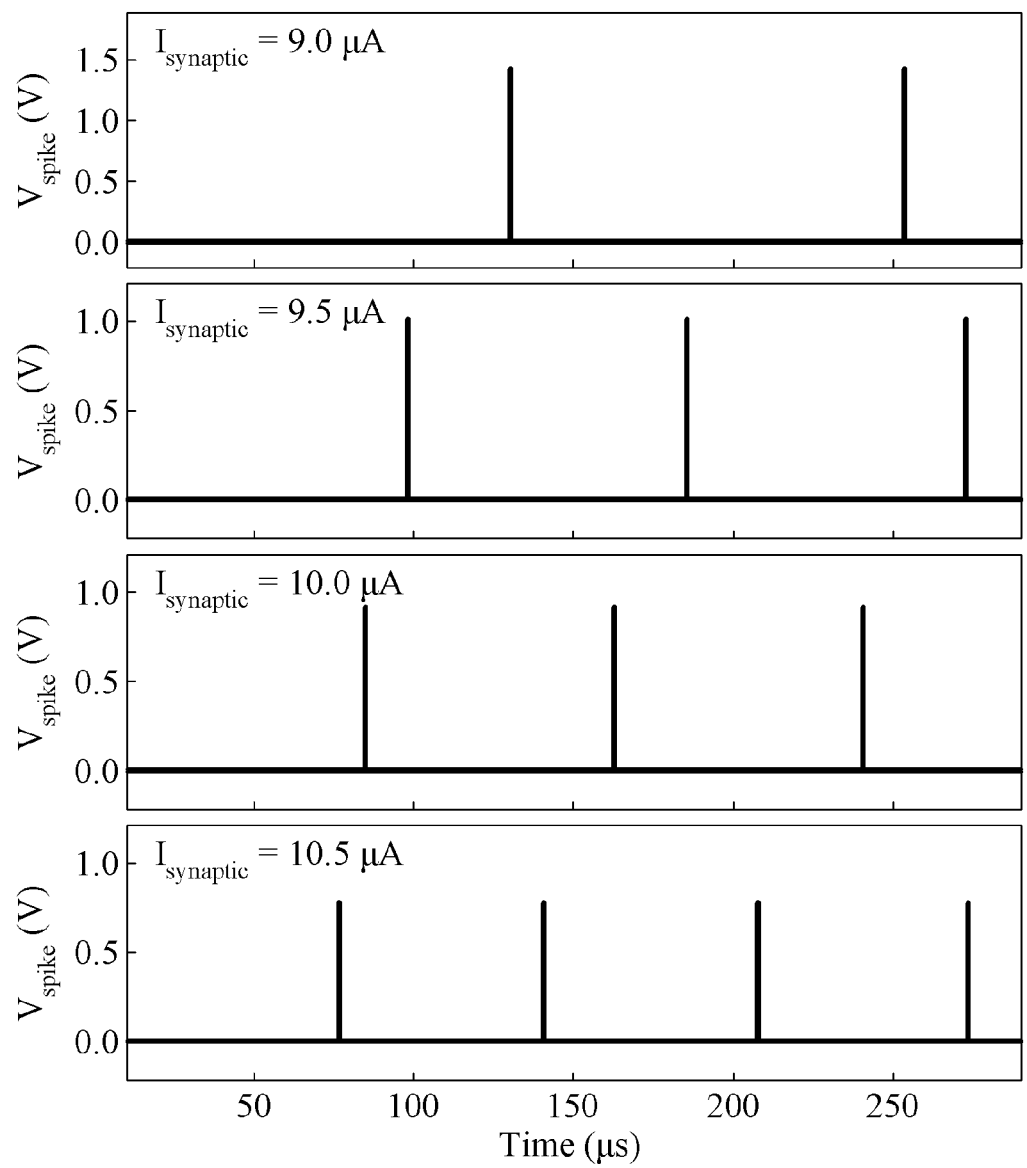
FIG. 5A is a timing chart showing change in output characteristics depending on change in the magnitude of a synapse current pulse applied to a neuron circuit.

FIG. 5A is a timing chart 510 showing change in output characteristics depending on change in the magnitude of a synapse current pulse applied to a neuron circuit.

As shown in FIG. 5A, the timing chart 510 shows that, when the magnitude of an applied synapse current pulse gradually increases from 9.5 µA to 10 µA, 10.5 µA, and 11 µA, fire time is shortened.

Figure 5B:
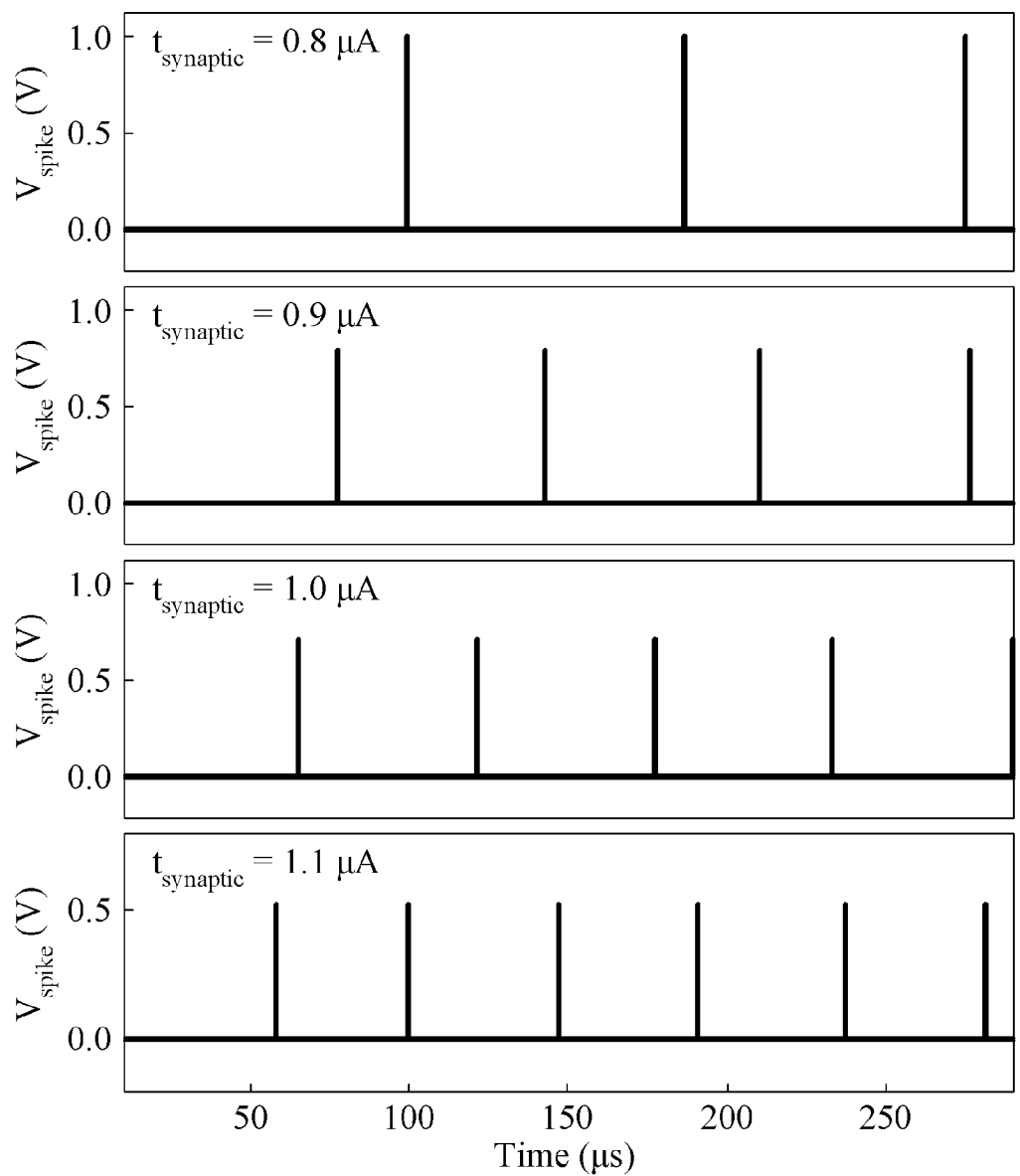
FIG. 5B is a timing chart showing change in output characteristics depending on time change of a synapse current pulse applied to a neuron circuit.

FIG. 5B is a timing chart 520 showing change in output characteristics depending on time change of a synapse current pulse applied to a neuron circuit.

As shown in FIG. 5B, the timing chart 520 shows that, as time change gradually increases from 0.6 µS to 0.7 µS, 0.8 µS, and 0.9 µS with respect to the magnitude of an applied synapse current pulse, fire time is shortened.

Figure 5C:
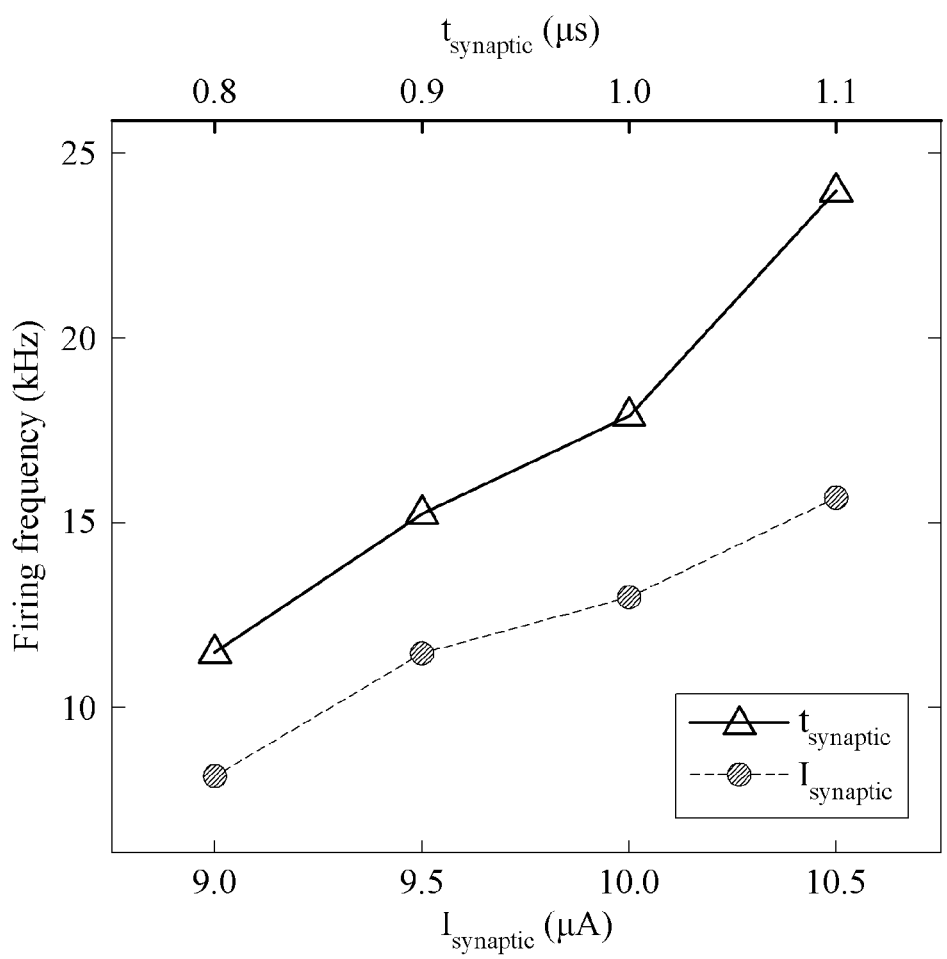
FIG. 5C is a diagram showing change in a firing frequency depending on the magnitude and time change of a synapse current pulse applied to a neuron circuit.

FIG. 5C is a timing chart 530 showing change in a firing frequency depending on the magnitude and time change of a synapse current pulse applied to a neuron circuit.

Changes in firing frequency characteristics depending on the magnitude and time change of a synapse current pulse applied to the neuron circuit were confirmed. As shown in FIG. 5B, as the magnitude of pre-synapse current increased and the time width of current generation increased, the time point at which firing of the neuron circuit occurred appeared quickly. This is because the amount of an electric charge integrated in the capacitor per unit time increases as the magnitude and generation time of current increase. Accordingly, as shown in FIG. 5C, as the magnitude of current ($I_{synaptic}$) and the time width ($t_{synaptic}$) of current generation increase, firing frequency increases.

As a result, according to the present disclosure, a neuron-imitating device having a simple structure capable of achieving high integration through fewer electrodes than conventional CMOS neuron-imitating devices may be developed.

In addition, according to the present disclosure, a device capable of operating with lower standby power consumption than conventional CMOS neuron devices may be developed, a neuron-imitating device and circuit to which a conventional CMOS process is applied may be developed, and a circuit capable of achieving high integration and low power consumption compared to conventional CMOS neuron circuits may be developed.

In addition, according to the present disclosure, a neuron circuit in which fire and reset are performed without a separate controller may be developed, and a neuron-imitating device and circuit that may be used in a spiking neural network may be developed.

According to one embodiment, compared to conventional neuron-imitating devices, a device having a simple structure that operates with a small number of electrodes can be used, thereby enabling implementation of a neuron circuit with high integration and low power consumption.

According to one embodiment, compared to conventional CMOS neuron-imitating devices, a neuron circuit with low standby power consumption using a device having a steep switching slope value due to a latch-up phenomenon can be implemented.

According to one embodiment, compared to conventional neuron circuits, by minimizing the number of transistors, a highly integrated circuit that operates with low power consumption can be implemented.

According to one embodiment, compared to conventional neuron circuits, a self-driving neuron circuit with low power consumption without application of an external bias can be implemented.

According to one embodiment, change in firing frequency characteristics of a neuron can be implemented according to the magnitude of synapse current transmitted as input to a neuron circuit and change in applied time width.

According to one embodiment, a neuron circuit to which a CMOS process can be applied can be applied to a spiking neural network.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A neuron circuit, wherein the neuron circuit generates potential by charging current input from synapses through a capacitor,
   wherein when the generated potential exceeds a critical value, the neuron circuit generates and outputs a spike voltage corresponding to the generated potential using a p-n-p-n diode connected to the capacitor, and
   wherein the p-n-p-n diode generates a spike voltage corresponding to the generated potential using an avalanche breakdown phenomenon occurred inside a diode device by an anode voltage.

2. The neuron circuit according to claim 1, wherein the neuron circuit resets the generated spike voltage using one or more transistors connected to the p-n-p-n diode.

3. The neuron circuit according to claim 2, wherein an anode electrode of the p-n-p-n diode is connected in parallel to the capacitor, and a cathode electrode of the p-n-p-n diode is connected to the transistors.

4. A neuron circuit, wherein the neuron circuit generates potential by charging current input from synapses through a capacitor,
   wherein when the generated potential exceeds a critical value, the neuron circuit generates and outputs a spike voltage corresponding to the generated potential using a p-n-p-n diode connected to the capacitor,
   wherein the neuron circuit resets the generated spike voltage using one or more transistors connected to the p-n-p-n diode,
   wherein an anode electrode of the p-n-p-n diode is connected in parallel to the capacitor, and a cathode electrode of the p-n-p-n diode is connected to the transistors,
   wherein, among the transistors, a gate electrode of a first transistor is connected to a gate line, and a drain electrode of the first transistor is connected in series to the cathode electrode of the p-n-p-n diode,
   wherein a gate electrode and drain electrode of a second transistor are commonly connected to the drain electrode of the first transistor and a source electrode of the p-n-p-n diode, and
   wherein a drain electrode of a third transistor is commonly connected to the capacitor and the anode electrode of the p-n-p-n diode, and a gate electrode of the third transistor is commonly connected to the gate electrode and drain electrode of the second transistor.

5. The neuron circuit according to claim 4, wherein the spike voltage is determined by voltage division between the first transistor and the p-n-p-n diode.

6. The neuron circuit according to claim 4, wherein a frequency of the spike voltage changes depending on change in a time width of the input pulse and a magnitude of the input pulse.

7. The neuron circuit according to claim 1, wherein the p-n-p-n diode is provided with a plurality of potential barriers, and the p-n-p-n diode uses the potential barriers to block injection of charge carriers before the anode voltage is applied.

8. The neuron circuit according to claim 7, wherein, when the anode voltage is increased to a predetermined reference voltage, the p-n-p-n diode induces, through the anode voltage, heights of the potential barriers in a valence band to be lowered, and when the heights of the potential barriers are lowered, the p-n-p-n diode operates to inject holes into potential wells.

9. The neuron circuit according to claim 4, wherein the p-n-p-n diode reduces the spike voltage by inducing reset current by a voltage generated in a gate electrode of the second transistor, and
   wherein the p-n-p-n diode resets the spike voltage by discharging an electric charge charged in the capacitor by inducing discharge current by a voltage generated in a gate electrode of the third transistor.

10. The neuron circuit according to claim 8, wherein, as current pulses input from synapses at the front end are integrated in the capacitor, the anode voltage increases,
   wherein, as the drain voltage increases, a potential barrier formed by a reverse voltage bias level formed inside the p-n-p-n diode increases, and wherein, as the potential barrier increases, when the drain voltage increases above a threshold voltage at which avalanche breakdown occurs, a latch-up phenomenon occurs.

11. The neuron circuit according to claim 10, wherein electrical fire occurs at an output electrode ($V_{spike}$) according to voltage distribution between the p-n-p-n diode and the first transistor due to current flowing according to the occurred latch-up phenomenon.

12. The neuron circuit according to claim 11, wherein, when a spike voltage is generated at the output electrode ($V_{spike}$), a reset operation is performed by discharging an electric charge and a voltage of $V_{spike}$ charged in the capacitor while both the second and third transistors are turned on by increased gate voltages of the second and third transistors.

13. A neuron circuit, wherein the neuron circuit generates potential by charging current input from synapses through a capacitor,
   wherein when the generated potential exceeds a critical value, the neuron circuit generates and outputs spike current corresponding to the generated potential using a p-n-p-n diode connected to the capacitor,
   wherein the neuron circuit resets the generated spike current using one or more transistors connected to the p-n-p-n diode, and
   wherein the p-n-p-n diode generates a spike voltage corresponding to the generated potential using an avalanche breakdown phenomenon occurred inside a diode device by an anode voltage.

* * * * *